United States Patent
Kim et al.

(10) Patent No.: US 11,616,214 B2
(45) Date of Patent: Mar. 28, 2023

(54) DISPLAY DEVICE

(71) Applicant: Samsung Display Co., LTD., Yongin-si (KR)

(72) Inventors: Il-Joo Kim, Hwaseong-si (KR); Gunwoo Ko, Seoul (KR); Yong-Hwan Kim, Asan-si (KR); Taekon Kim, Asan-si (KR); Hyunyoung Kim, Asan-si (KR); Jong-Ryuk Park, Cheonan-si (KR); Wangwoo Lee, Osan-si (KR); Hyungjun Lim, Asan-si (KR); Youngbae Jung, Cheonan-si (KR); Jung-Hyun Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 277 days.

(21) Appl. No.: 17/138,124

(22) Filed: Dec. 30, 2020

(65) Prior Publication Data

US 2021/0367212 A1   Nov. 25, 2021

(30) Foreign Application Priority Data

May 22, 2020   (KR) .......................... 10-2020-0061700

(51) Int. Cl.
*G06F 3/041* (2006.01)
*H01L 51/52* (2006.01)
*H01L 27/32* (2006.01)

(52) U.S. Cl.
CPC ........ *H01L 51/5275* (2013.01); *G06F 3/0412* (2013.01); *H01L 27/323* (2013.01); *H01L 27/3244* (2013.01); *H01L 51/5281* (2013.01)

(58) Field of Classification Search
CPC ............... H01L 51/5275; H01L 27/323; H01L 27/3244; H01L 51/5281; H01L 27/3246;
(Continued)

(56) References Cited

U.S. PATENT DOCUMENTS 9,075,242 B2   7/2015   Jeong et al.
9,997,553 B2 *  6/2018   Shibata ............... H01L 27/1462
(Continued)

FOREIGN PATENT DOCUMENTS

KR   10-2018-0005323   1/2018
KR   10-2019-0003181   1/2019
(Continued)

*Primary Examiner* — Temesghen Ghebretinsae
*Assistant Examiner* — Sosina Abebe
(74) *Attorney, Agent, or Firm* — Kile Park Reed & Houtteman PLLC

(57) ABSTRACT

A display device includes a display layer including an active area including a plurality of pixel areas, and a peripheral area adjacent to the active area, an insulating layer disposed on the display layer, the insulating layer including at least one first opening overlapping the plurality of pixel areas, and at least one second opening in the peripheral area, a refractive index layer disposed on the insulating layer, having a refractive index greater than a refractive index of the insulating layer, and spaced apart from the at least one second opening, and a polarizing layer overlapping the refractive index layer. At least a portion of the polarizing layer overlaps the at least one second opening.

24 Claims, 12 Drawing Sheets

(58) Field of Classification Search
CPC ............ H01L 27/3225; H01L 27/3248; H01L 27/3258; H01L 51/5253; H01L 2251/5338; G06F 3/0412; G06F 3/041–044
See application file for complete search history.

(56) References Cited

U.S. PATENT DOCUMENTS

| | | | |
|---|---|---|---|
| 10,224,377 B2 | 3/2019 | Park et al. | |
| 10,541,385 B2* | 1/2020 | Sakamoto | H01L 51/56 |
| 2011/0115740 A1* | 5/2011 | Qian | G06F 3/045 |
| | | | 345/174 |
| 2013/0265253 A1* | 10/2013 | Lin | G06F 3/041 |
| | | | 345/173 |
| 2015/0048333 A1* | 2/2015 | Choi | H01L 51/5275 |
| | | | 257/40 |
| 2015/0060778 A1* | 3/2015 | Kim | H01L 27/3258 |
| | | | 438/23 |
| 2015/0123086 A1* | 5/2015 | Lee | H01L 51/5275 |
| | | | 438/26 |
| 2016/0320885 A1* | 11/2016 | Kim | G06F 3/0446 |
| 2017/0179211 A1* | 6/2017 | Kanaya | H01L 27/3258 |
| 2017/0323779 A1* | 11/2017 | Um | G02F 1/133345 |
| 2017/0357348 A1* | 12/2017 | Lee | G02B 1/14 |
| 2019/0004654 A1 | 1/2019 | Gwon et al. | |
| 2019/0012031 A1* | 1/2019 | Kim | G06F 3/0412 |
| 2019/0013495 A1 | 1/2019 | Kim et al. | |
| 2019/0051711 A1* | 2/2019 | Lee | H01L 51/5256 |
| 2019/0115395 A1* | 4/2019 | Lee | G06F 3/0446 |
| 2019/0165061 A1* | 5/2019 | Jung | H01L 27/3218 |
| 2020/0083484 A1 | 3/2020 | Lee et al. | |

FOREIGN PATENT DOCUMENTS

| | | |
|---|---|---|
| KR | 10-2019-0004863 | 1/2019 |
| KR | 10-2019-0073061 | 6/2019 |
| KR | 10-2020-0028257 | 3/2020 |

* cited by examiner

DISPLAY DEVICE

CROSS-REFERENCE TO RELATED APPLICATION(S)

This U.S. non-provisional patent application claims priority to and the benefit of Korean Patent Application No. 10-2020-0061700 under 35 U.S.C. § 119, filed in the Korean Intellectual Property Office (KIPO) on May 22, 2020, the contents of which are incorporated herein by reference in its entirety.

BACKGROUND

1. Technical Field

The disclosure relates to a display device having improved reliability.

2. Description of the Related Art

A display device includes an active area activated in response to electrical signals. The display device senses inputs applied from the outside through the active area and simultaneously displays a variety of images to provide information to users.

Lights generated by a light emitting layer of the display device are emitted not only in a front direction but also in a lateral direction. A light efficiency is determined based on the lights emitted in the front direction. Thus, the lights emitted in the lateral direction deteriorates the light efficiency.

SUMMARY

The disclosure provides a display device having improved reliability.

In an aspect, an embodiment provides a display device including a display layer including an active area including a plurality of pixel areas, and a peripheral area adjacent to the active area, an insulating layer disposed on the display layer, with the insulating layer comprising at least one first opening overlapping the plurality of pixel areas, and at least one second opening in the peripheral area, a refractive index layer disposed on the insulating layer, having a refractive index greater than a refractive index of the insulating layer, and spaced apart from the at least one second opening of the insulating layer, and a polarizing layer overlapping the refractive index layer. At least a portion of the polarizing layer may overlap the at least one second opening of the insulating layer.

In an embodiment, the refractive index layer may not overlap the at least one second opening.

In an embodiment, the polarizing layer may overlap the at least one second opening.

In an embodiment, the display device may further include a protecting layer. The peripheral area may include a bending area, and the protecting layer may be disposed in the bending area and spaced apart from the refractive index layer.

In an embodiment, the protecting layer may contact the polarizing layer.

In an embodiment, the insulating layer may include an organic material.

In an embodiment, the polarizing layer may have an area greater than an area of the refractive index layer in a plan view.

In an embodiment, the at least one second opening of the insulating layer may comprise a first portion extending in a first direction, and a second portion extending towards an edge of the display layer in a second direction intersecting the first direction.

In an embodiment, an end of the refractive index layer and an end of the polarizing layer may be spaced apart from each other, and the at least one second opening is disposed between the ends the refractive index layer and the polarizing layer.

In an embodiment, the at least one second opening of the insulating layer may extend in a first direction and is spaced apart from an edge of the display layer in a second direction intersecting the first direction.

In an embodiment, the display device may further include a first protrusion disposed in the peripheral area, surrounding at least a portion of the active area, and disposed under the refractive index layer.

In an embodiment, the at least one second opening of the insulating layer may be disposed between an end of the polarizing layer and the first protrusion.

In an embodiment, the refractive index layer may overlap a first protrusion.

In an embodiment, the display device may further include a second protrusion disposed in the peripheral area, surrounding at least a portion of the active area, and spaced apart from the at least one second opening of the insulating layer. The first protrusion may be disposed between the second protrusion and at least one second opening.

In an embodiment, the insulating layer may include at least one third opening between the first protrusion and the second protrusion.

In an embodiment, the refractive index layer may overlap the at least one third opening.

In an embodiment, the at least one third opening may include a plurality of third openings, and the plurality of third openings may be spaced apart from each other in a first direction in a plan view.

The at least one second opening may include a plurality of second openings, and the plurality of second openings are spaced apart from each other in a first direction and a second direction intersecting the first direction.

In an embodiment, a display device may include a display layer including an active area comprising a plurality of pixel areas, a first area adjacent to the active area, and a bending area adjacent to the first area, a sensor layer disposed on the display layer, the sensor layer including a plurality of sensing electrodes, an insulating layer disposed on the sensor layer, the insulating layer including at least one first opening overlapping the plurality of pixel areas, and at least one second opening overlapping the first area, a refractive index layer disposed on the insulating layer and spaced apart from the at least one second opening, and a protecting layer spaced apart from the refractive index layer and overlapping the bending area.

In an embodiment, the refractive index layer may have a refractive index greater than a refractive index of the insulating layer.

In an embodiment, the refractive index layer may not overlap the at least one second opening, and the protecting layer may not overlap the at least one second opening.

In an embodiment, the insulating layer may include an organic material, and the refractive index layer may be disposed directly on the insulating layer.

In an embodiment, the insulating layer may include a third opening between the at least one second opening and the active area.

In an embodiment, the third opening may be filled with the refractive index layer.

In an embodiment, the at least one second opening may include a plurality of second openings, and the plurality of second openings may be spaced apart from each other in the first direction and the second direction intersecting the first direction.

In an embodiment, an area in which the refractive index layer is disposed may be controlled (or adjusted) by the opening formed through the insulating layer. An upper flatness of the high-refractive index layer may be controlled by the controlled area of the refractive index layer. A thickness of the protrusion formed in the refractive index layer may be reduced by the opening, or the protrusion formed in the refractive index layer may be controlled to overlap the peripheral area. The protrusion may be prevented from being viewed from the outside of the display device. Thus, the display device having improved reliability may be provided.

In an embodiment, the end of the refractive index layer may be disposed to be closer to the active area than the opening is. The protecting layer may be spaced apart from the active area with the opening interposed therebetween. The refractive index layer may be prevented from contacting the protecting layer by the opening. The protecting layer may be prevented from being detached because of an interfacial adhesion property between the refractive index layer and the protecting layer. Accordingly, the display device having improved reliability may be provided.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
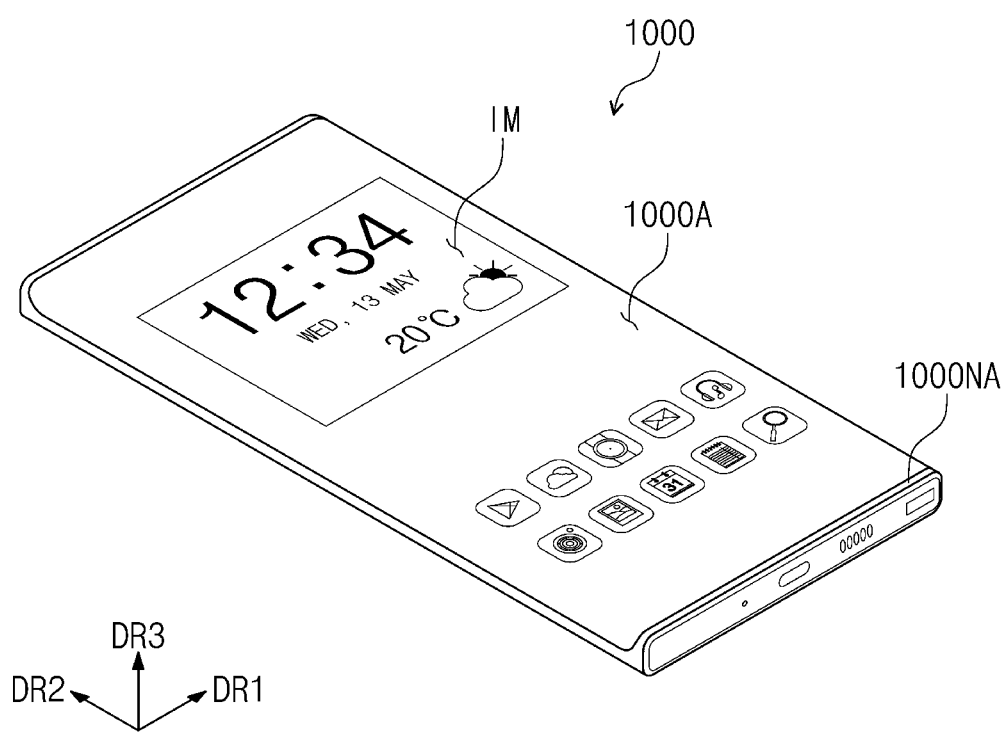
FIG. 1 is a schematic perspective view showing a display device according to an embodiment of the disclosure.

Since the disclosure may have diverse modified embodiments, some embodiments are illustrated in the drawings and are described in the detailed description of the disclosure. However, this does not limit the disclosure within specific embodiments and it should be understood that the disclosure covers all the modifications, equivalents, and replacements within the idea and technical scope of the disclosure.

In the disclosure, it will be understood that when an element or layer is referred to as being "on," "connected to," or "coupled to" another element or layer, it can be directly on, or connected or coupled to the other element or layer or intervening elements or layers may be present. It will also be understood that when an element or layer "directly contacts" another element or layer, no other intervening layers or elements are present. For example, if a layer is "directly disposed" on another layer, the layer may be disposed on the other layer without using an additional member such as an adhesive member.

Like reference numerals refer to like elements throughout. In the drawings, the thickness, ratio, and dimension of components may be exaggerated for effective description of the technical content.

As used herein, the term "and/or" includes any and all combinations of one or more of the associated listed items. For example, "A and/or B" may be understood to mean "A, B, or A and B."

It will be understood that, although the terms "first," "second," or the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the claims. The singular forms, "a," "an," and "the" are intended to include the plural forms as well, unless the context clearly indicates otherwise.

Spatially relative terms, such as "beneath," "below," "lower," "above," "upper" and the like may be used herein to describe one element or feature's relationship to another element(s) or feature(s) as illustrated in the figures.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an ideal or excessively formal sense unless clearly defined herein.

It will be further understood that the terms "include" and/or "including," when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, the embodiments will be explained in detail with reference to the accompanying drawings.

FIG. 1 is a schematic perspective view showing a display device 1000 according to an embodiment.

Referring to FIG. 1, the display device 1000 may be a device activated in response to electrical signals. For example, the display device 1000 may be a mobile phone, a tablet computer, a car navigation unit, a game unit, or a wearable unit, however, the embodiments are not limited thereto. FIG. 1 shows the mobile phone as a representative example of the display device 1000.

The display device 1000 may include an active area 1000A and a peripheral area 1000NA.

The active area 1000A may be an area through which an image IM is displayed. The active area 1000A may include a surface defined by (or parallel to) a first direction DR1 and a second direction DR2. The active area 1000A may further include curved surfaces respectively bent and/or extending from at least two side portions of the plane. However, the shape of the active area 1000A should not be limited thereto. For example, the active area 1000A may include only the surface or may further include two or more curved surfaces, e.g., four curved surfaces respectively bent and/or extending from four side portions of the plane.

The peripheral area 1000NA may be adjacent to the active area 1000A. The peripheral area 1000NA may surround the active area 1000A. However, this is merely an example, and the shape of the active area 1000A and the shape of the peripheral area 1000NA may be designed relative to each other.

Although the first to third directional axes DR1, DR2, and DR3 are illustrated in the figures, directions indicated by the first to third directional axes DR1, DR2, and DR3 are relative directions and may be interchanged. The directions indicated by the first to third directional axes DR1, DR2, and DR3 may be referred to as first to third directions and may be designated by the same reference numerals, i.e., DR1, DR2, and DR3.

In this specification, the first directional axis DR1 and the second directional axis DR2 are perpendicular to each other, and the third directional axis DR3 is a normal direction with respect to a plane defined by the first and second directional axes DR1 and DR2.

A third direction DR3 may indicate a thickness direction of the display device 1000. The third direction DR3 may intersect the first direction DR1 and the second direction DR2. Front (or upper) and rear (or lower) surfaces of each member of the display device 1000 may be defined with respect to the third direction DR3. The expression "when viewed in a plane" or "in a plan view" may be defined as viewing the object from above in the third direction DR3.

Figure 2:
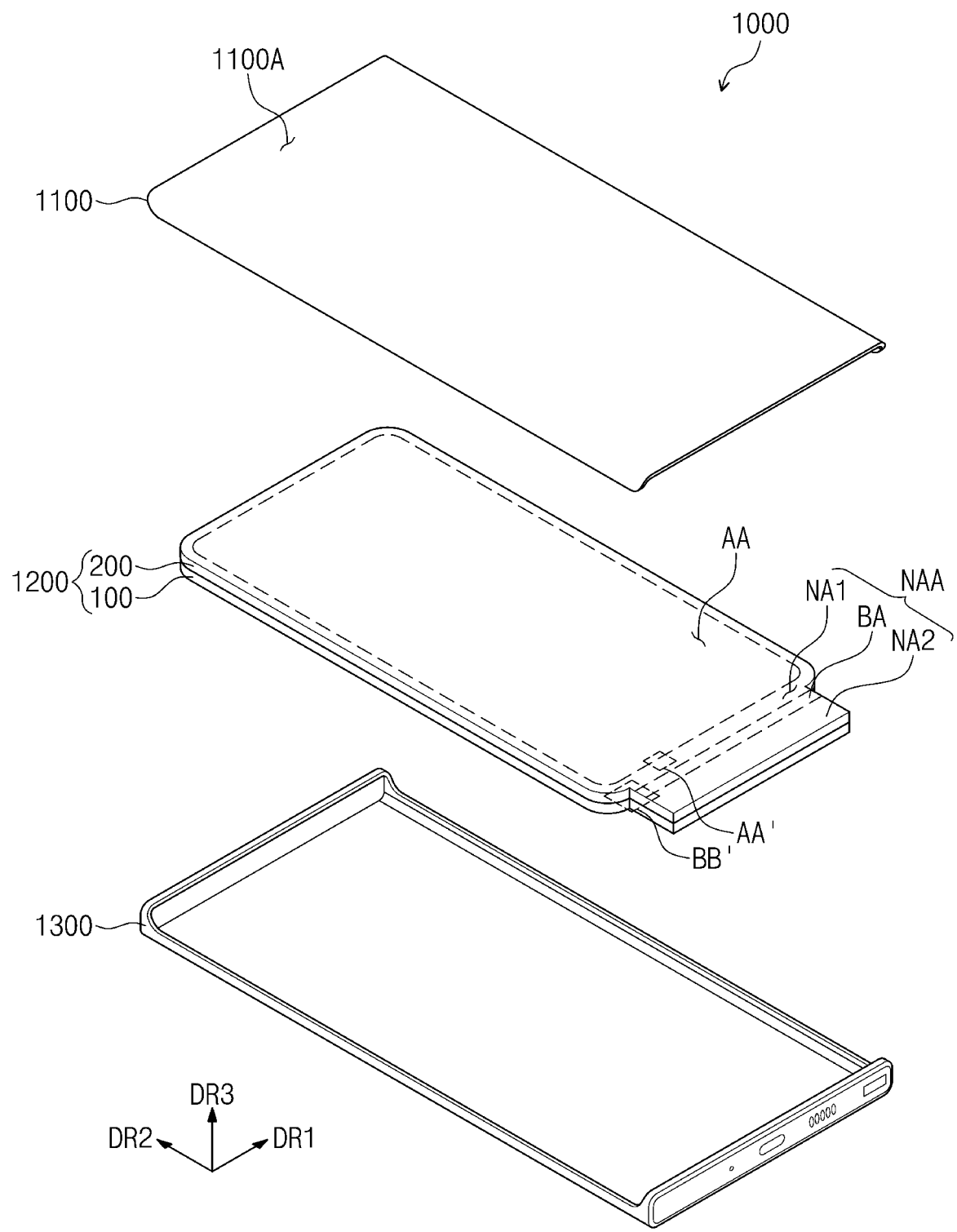
FIG. 2 is a schematic exploded perspective view showing a display device according to an embodiment.

FIG. 2 is a schematic exploded perspective view showing the display device 1000 according to an embodiment.

Referring to FIG. 2, the display device 1000 may include a window 1100, a display panel 1200, and an external case 1300. The window 1100 and the external case 1300 may be connected to each other to define an appearance of the display device 1000.

The display panel 1200 may include a display layer 100 and a sensor layer 200.

The display layer 100 may display the image IM (refer to FIG. 1). The display layer 100 according to the embodiment of the disclosure may be a light emitting type display layer. However, the embodiments are not limited thereto. For example, the display layer 100 may be an organic light emitting display layer, a quantum dot display layer, a nano-LED display layer, or a micro-LED display layer. A light emitting layer of the organic light emitting display layer may include an organic light emitting material. A light emitting layer of the quantum dot display layer may include a quantum dot or a quantum rod. A light emitting layer of the nano-LED display layer and the micro-LED display layer may include a small LED element of several hundred micrometers or less. Hereinafter, the organic light emitting display layer will be described as the display layer 100 as a representative example.

The sensor layer 200 may be disposed on the display layer 100. The sensor layer 200 may obtain coordinate information of an input, e.g., an external input. The sensor layer 200 may sense a variety of external inputs. For example, the sensor layer 200 may sense an input by a user's body (e.g., finger) or may sense external inputs of various forms, such as light, heat, or pressure. The sensor layer 200 may sense the input near a sensing surface in addition to the input that contacts the sensing surface.

An active area AA and a peripheral area NAA may be defined in the display layer 100 and the sensor layer 200. The active area AA may be the area on which the image IM (refer to FIG. 1) is displayed and the external input is sensed. The active area AA may overlap the active area 1000A (refer to FIG. 1) of the display device 1000. For example, the active area AA may overlap a portion or all of the active area 1000A (refer to FIG. 1) of the display device 1000. Accordingly, the user may view the image IM (refer to FIG. 1) on the active area AA or may provide the external input on or through the active area AA. However, this is merely exemplary. For example, the area on which the image IM (refer to FIG. 1) is displayed and the area on (or through) which the external input is sensed may be separated from each other within the active area 1000A of the display device 1000, and they should not be particularly limited thereto.

The peripheral area NAA may overlap the peripheral area 1000NA (refer to FIG. 1) of the display device 1000. The peripheral area NAA may surround or be adjacent to the active area AA. A driving circuit or a driving line may be disposed in the peripheral area NAA to drive the active area AA, and various signal lines or pads that provide electrical signals to the active area AA or electronic elements may be disposed in the peripheral area NAA.

The peripheral area NAA may include a first area NA1, a bending area BA, and a second area NA2, which are defined therein. The first area NA1 may surround the active area AA. The second area NA2 may extend in a direction opposite to the second direction DR2 from the bending area BA. The bending area BA may be disposed between the first area NA1 and the second area NA2. The bending area BA may be bent toward a rear surface of the display layer 100, such that the second area NA2 may face the first area NA1. A portion of the peripheral area NAA may be bent, such that a size of the peripheral area 1000NA (refer to FIG. 1) of the display device 1000 may be reduced.

The window 1100 may be disposed on the display panel 1200 and may cover or overlap the active area AA. Edges of the window 1100 may be curved. The window 1100 may include an optically transparent insulating material. For example, the window 1100 may include a glass or plastic material. The window 1100 may have a single-layer or multi-layer structure. As an example, the window 1100 may include plastic films attached to each other by an adhesive or a glass substrate and a plastic film attached to the glass substrate by an adhesive. Although not shown, a light blocking layer may be disposed in an area of the window 1100, which overlaps the peripheral area 1000NA.

The window 1100 may include a front surface 1100A that defines the active area 1000A (refer to FIG. 1) of the display device 1000.

Although not shown, the window 1100 may further include a functional coating layer. The functional coating layer may include an anti-fingerprint layer, an anti-reflection layer, and a hard coating layer.

The external case 1300 may be connected to the window 1100 to define the appearance of the display device 1000. In FIG. 2, the external case 1300 implemented by one member is shown as an example. However, the embodiments are not limited thereto. For example, the external case 1300 may include two or more components assembled to each other.

Figure 3:
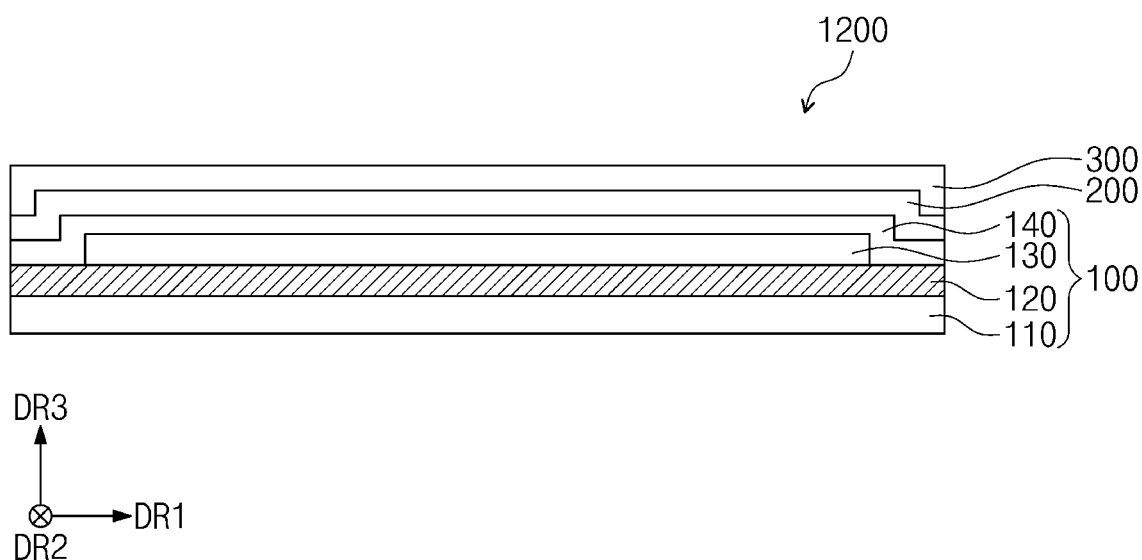
FIG. 3 is a schematic cross-sectional view schematically showing a display panel according to an embodiment.

FIG. 3 is a schematic cross-sectional view showing the display panel 1200 according to an embodiment.

Referring to FIG. 3, the display panel 1200 may include the display layer 100, the sensor layer 200, and a refractive index layer 300, for example, a high-refractive index layer 300.

The display layer 100 may include a base layer 110, a circuit layer 120, a light emitting element layer 130, and an encapsulation layer 140.

The base layer 110 may be a member that provides a base surface on which the light emitting layer is disposed. The base layer 110 may be a glass substrate, a metal substrate, or a polymer substrate. However, the embodiments are not limited thereto. For example, the base layer 110 may be an inorganic layer, an organic layer, or a composite material layer.

The base layer 110 may have a multi-layer structure. For instance, the base layer 110 may have a three-layer structure of a synthetic resin layer, an adhesive layer, and a synthetic resin layer. The synthetic resin layer may include a polyimide-based resin. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin," as used herein, refers to a resin that includes a functional group of X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. The semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro-LED, or a nano-LED. The light emitting element layer 130 may be referred to as the light emitting layer 130.

The encapsulation layer 140 may be disposed on the light emitting element layer 130. The encapsulation layer 140 may include a first inorganic layer, an organic layer, and a second inorganic layer, which are sequentially stacked. However, the layers of the encapsulation layer 140 should not be limited thereto.

The inorganic layers may protect the light emitting element layer 130 from moisture and oxygen, and the organic layers may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer. However, the embodiments are not limited thereto.

The sensor layer 200 may be disposed on the display layer 100. The sensor layer 200 may be formed on the display layer 100 through successive processes. In this case, the sensor layer 200 may be disposed directly on the display layer 100. For example, a separate adhesive member may not be disposed between the sensor layer 200 and the display layer 100. However, this is merely an example, and the sensor layer 200 should not be limited thereto.

The high-refractive index layer 300 may be disposed on the sensor layer 200. The high-refractive index layer 300 may include at least one of a light path control layer that changes a light path and an anti-reflection layer that reduces a reflectance of external light incident from the outside.

Figure 4:
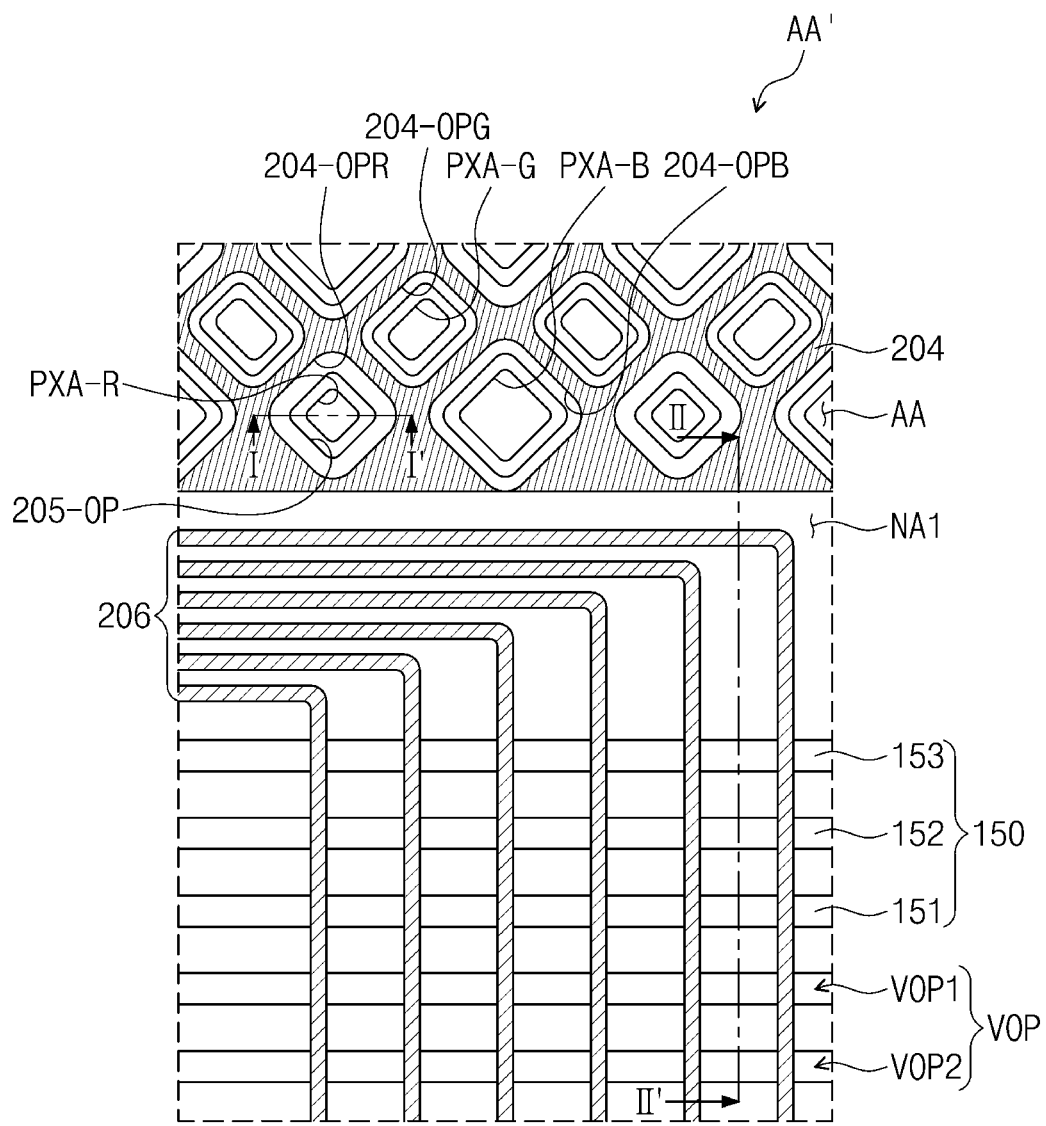
FIG. 4 is a schematic plan view showing area AA' of FIG. 2 according to an embodiment.

FIG. 4 is a schematic plan view showing area AA' of FIG. 2 according to an embodiment.

Referring to FIG. 4, pixel areas PXA-R, PXA-B, and PXA-G may be defined in the active area AA. The pixel areas PXA-R, PXA-B, and PXA-G may include a first pixel area PXA-R, a second pixel area PXA-B, and a third pixel area PXA-G.

The first pixel area PXA-R, the second pixel area PXA-B, and the third pixel area PXA-G may have different sizes from each other. The first pixel area PXA-R may have a first size, the second pixel area PXA-B may have a second size, and the third pixel area PXA-G may have a third size. The second size may be greater than the first size, and the first size may be greater than the third size.

The first pixel area PXA-R may correspond to a red pixel that generates a red light. The second pixel area PXA-B may correspond to a blue pixel that generates a blue light. The third pixel area PXA-G may correspond to a green pixel that generates a green light.

The first pixel area PXA-R and the second pixel area PXA-B may be alternately arranged with each other in the first direction DR1 and the second direction DR2. There may be multiple third pixel areas PXA-G, which may be arranged in the first direction DR1 and the second direction DR2.

In FIG. 4, the first pixel area PXA-R, the second pixel area PXA-B, and the third pixel area PXA-G are arranged in a Pentile® pattern. However, the embodiments are not limited thereto. For example, the first pixel area PXA-R, the second pixel area PXA-B, and the third pixel area PXA-G may be arranged in a stripe pattern. In the stripe pattern, the first pixel area PXA-R, the second pixel area PXA-B, and the third pixel area PXA-G may be alternately arranged in the first direction DR1, and the same pixel areas may be arranged in the second direction DR2.

A sensing electrode layer 204 may have a mesh shape. The sensing electrode layer 204 may include multiple sensor openings 204-OPR, 204-OPB, and 204-OPG defined therethrough. Accordingly, in a plan view, the sensing electrode layer 204 may not overlap the first pixel area PXA-R, the second pixel area PXA-B, and the third pixel area PXA-G.

For example, a first sensor opening 204-OPR may be defined in an area corresponding to the first pixel area PXA-R, a second sensor opening 204-OPB may be defined in an area corresponding to the second pixel area PXA-B, and a third sensor opening 204-OPG may be defined in an area corresponding to the third pixel area PXA-G.

An opening 205-OP may be defined between the first pixel area PXA-R and the first sensor opening 204-OPR, between the second pixel area PXA-B and the second sensor opening 204-OPB, and between the third pixel area PXA-G and the third sensor opening 204-OPG. The opening 205-OP may be referred to as a first opening 205-OP. The opening 205-OP will be described below.

A sensor line 206 may be disposed in the first area NA1 of the peripheral area NAA (refer to FIG. 2). The sensor line 206 may be electrically connected to the sensing electrode layer 204. The sensor line 206 may transmit an input signal sensed by the sensing electrode layer 204.

There may be multiple sensor lines 206. Each of the sensor lines 206 may extend along an outer periphery of the peripheral area NAA (refer to FIG. 2) adjacent to the active area AA and may extend in a direction opposite to the second direction DR2. The sensor lines 206 may be spaced apart from each other.

Multiple protrusions 150 may be disposed in the first area NA1. The protrusions 150 may surround or be adjacent to at least a portion of the active area AA. For example, in an embodiment, each of the protrusions 150 may entirely surround the active area AA. In another embodiment, each of the protrusions 150 may surround at least a portion of the active area AA. Each of the protrusions 150 may have a closed curve shape. As another example, a portion of the protrusions 150 may have an open shape.

The protrusions 150 may include a first protrusion 151, a second protrusion 152, and a third protrusion 153. However, the number of the protrusions 150 should not be limited thereto. The number of the protrusions 150 may be two or may be four or more.

The first protrusion 151 may be disposed farthest from the active area AA among the protrusions 150. The first protrusion 151, the second protrusion 152, and the third protrusion 153 may be sequentially arranged in a direction toward the active area AA. The protrusions 150 may be spaced apart from each other. The second protrusion 152 may surround at least a portion of the third protrusion 153. The first protrusion 151 may surround at least a portion of the second protrusion 152.

Organic openings VOP may be defined in the first area NA1. The organic openings VOP may be defined to be spaced apart from the second protrusion 152 with the first protrusion 151 interposed therebetween in the second direction DR2.

The organic openings VOP may include a first organic opening VOP1 and a second organic opening VOP2. However, the number of the organic openings VOP should not be limited thereto. There may be a single organic opening VOP, or three or more organic openings VOP may be provided.

The first organic opening VOP1 and the second organic opening VOP2 may be sequentially defined in a direction away from the active area AA. The organic openings VOP will be described below.

Figure 5:
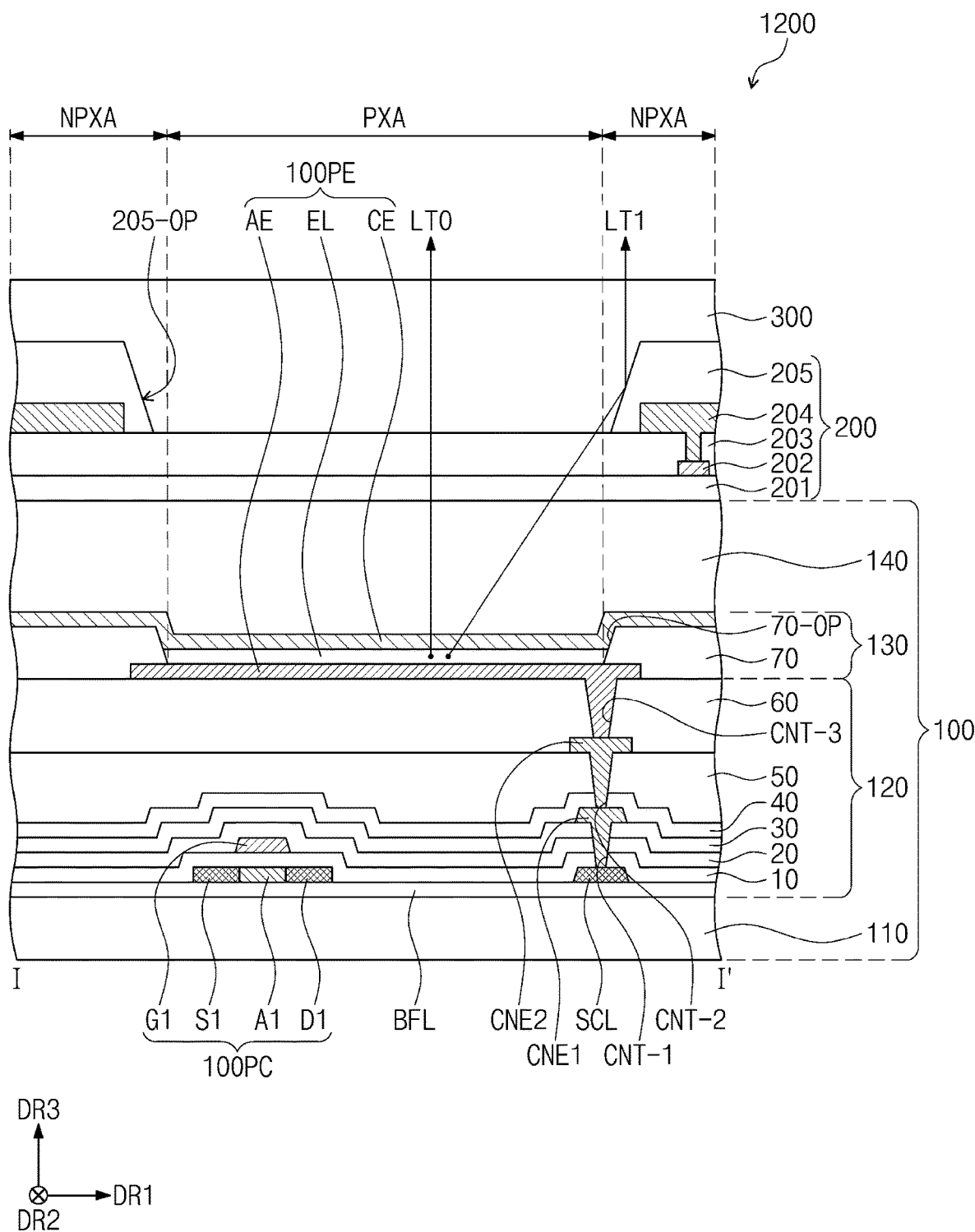
FIG. 5 is a schematic cross-sectional view taken along line I-I' of FIG. 4.

FIG. 5 is a schematic cross-sectional view taken along line I-I' of FIG. 4.

Referring to FIG. 5, at least one inorganic layer may be formed on an upper surface of the base layer 110. The inorganic layer may include at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. In an embodiment, the display layer 100 may include a buffer layer BFL.

The buffer layer BFL may increase a coupling force between the base layer 110 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon. However, the embodiments are not limited thereto. The semiconductor pattern may include amorphous silicon or metal oxide.

FIG. 5 shows only a portion of the semiconductor pattern, and the semiconductor pattern may be further disposed in other areas. The semiconductor pattern may be arranged in a specific manner over the pixels. The semiconductor pattern may have different electrical properties depending on whether it is doped. The semiconductor pattern may include a doped region and a non-doped region. The doped region may be doped with an N-type dopant or a P-type dopant. A P-type transistor may include a doped region doped with the P-type dopant, and an N-type transistor may include a doped region doped with the N-type dopant.

The doped region may have a conductivity greater than that of the non-doped region and may substantially function as an electrode or signal line. The non-doped region may substantially correspond to an active layer (or channel) of the transistor. In other words, a portion of the semiconductor pattern may be the active layer of the transistor, another portion of the semiconductor pattern may be a source or a drain of the transistor, and the other portion of the semiconductor pattern may be a connection electrode or a connection signal line.

Each of the pixels may have an equivalent circuit including seven transistors, one capacitor, and a light emitting element, and the equivalent circuit may be changed in various ways. FIG. 5 shows one transistor 100PC and the light emitting element 100PE included in the pixel.

A source S1, an active layer A1, and a drain D1 of the transistor 100PC may be formed from the semiconductor pattern. The source S1 and the drain D1 may extend from the active layer A1 in opposite directions in a cross-section. FIG. 5 shows a portion of a connection signal line SCL formed from the semiconductor pattern. Although not shown in figures, the connection signal line SCL may be electrically connected to the drain D1 of the transistor 100PC in a plane or layer.

A first insulating layer 10 may be disposed on the buffer layer BFL. The first insulating layer 10 may commonly overlap or cover the pixels and the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, and hafnium oxide. In an embodiment, the first insulating layer 10 may have a single-layer structure of a silicon oxide layer. Not only the first insulating layer 10, but also an insulating layer of the circuit layer 120 described below may be an inorganic layer and/or an organic layer and may have a single-layer or multi-layer structure. The inorganic layer may include at least one of the above-mentioned materials. However, the embodiments are not limited thereto.

A gate G1 of the transistor 100PC may be disposed on the first insulating layer 10. The gate G1 may be a portion of a metal pattern. The gate G1 may overlap the active layer A1. The gate G1 may function as a mask in a process of doping the semiconductor pattern.

A second insulating layer 20 may be disposed on the first insulating layer 10 and may cover or overlap the gate G1. The second insulating layer 20 may commonly overlap the pixels. The second insulating layer 20 may be an inorganic layer and/or an organic layer and may have a single-layer or multi-layer structure. In an embodiment, the second insulating layer 20 may be (or comprise) a single-layered silicon oxide layer.

A third insulating layer 30 may be disposed on the second insulating layer 20. In an embodiment, the third insulating layer 30 may be (or comprise) a single-layered silicon oxide layer.

A first connection electrode CNE1 may be disposed on the third insulating layer 30. The first connection electrode CNE1 may be electrically connected to the connection signal line SCL through a contact hole CNT-1 defined through the first, second, and third insulating layers 10, 20, and 30.

A fourth insulating layer 40 may be disposed on the third insulating layer 30. The fourth insulating layer 40 may be (or comprise) a single-layered silicon oxide layer. A fifth insulating layer 50 may be disposed on the fourth insulating layer 40. The fifth insulating layer 50 may be or comprise an organic layer.

A second connection electrode CNE2 may be disposed on the fifth insulating layer 50. The second connection electrode CNE2 may be electrically connected to the first connection electrode CNE1 through a contact hole CNT-2 defined through the fourth insulating layer 40 and the fifth insulating layer 50.

A sixth insulating layer 60 may be disposed on the fifth insulating layer 50 and may cover or overlap the second connection electrode CNE2. The sixth insulating layer 60 may be (or comprise) an organic layer.

The light emitting element layer 130 including the light emitting element 100PE may be disposed on the circuit layer 120. The light emitting element 100PE may include a first electrode AE, a light emitting layer EL, and a second electrode CE.

The first electrode AE may be disposed on the sixth insulating layer 60. The first electrode AE may be electrically connected to the second connection electrode CNE2 through a contact hole CNT-3 defined through the sixth insulating layer 60.

A pixel definition layer 70 may be disposed on the sixth insulating layer 60 and may overlap a portion of the first electrode AE. An opening 70-OP may be defined through the pixel definition layer 70. At least a portion of the first electrode AE may be exposed through the opening 70-OP of the pixel definition layer 70. In an embodiment, the light emitting area PXA may be defined to correspond to the portion of the first electrode AE exposed through or in the opening 70-OP. The light emitting area PXA may correspond to the pixel areas PXA-R, PXA-B, and PXA-G of FIG. 4. The non-light-emitting area NPXA may be adjacent to the light emitting area PXA The light emitting layer EL may be disposed on the first electrode AE. The light emitting layer EL may be disposed in the opening 70-OP. For example, the light emitting layer EL may be divided into portions and formed in each of the pixels. In this case, each of the light emitting layers EL may emit a light having at least one of blue, red, and green colors. However, the embodiments are not limited thereto. For example, the light emitting layer EL may be electrically connected to the pixels and may be commonly provided. In this case, the light emitting layer EL may provide a blue light or a white light.

The second electrode CE may be disposed on the light emitting layer EL. The second electrode CE may have an integral shape and may be commonly disposed over the pixels.

Although not shown in figures, a hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the pixels using an open mask.

The encapsulation layer 140 may be disposed on the light emitting element layer 130. The encapsulation layer 140 may protect the light emitting element layer 130 from moisture, oxygen, and foreign substances such as dust particles.

The sensor layer 200 may include a base layer 201, a first sensing electrode layer 202, a sensing insulating layer 203, a second sensing electrode layer 204, and an insulating layer 205.

The base layer 201 may be an inorganic layer including one of silicon nitride, silicon oxynitride, and silicon oxide. As another example, the base layer 201 may be an organic layer including an epoxy-based resin, an acryl-based resin, or an imide-based resin. The base layer 201 may have a single-layer structure or a multi-layer structure of layers stacked in the third direction DR3.

The first sensing electrode layer 202 and the second sensing electrode layer 204 may be disposed on the base layer 201. The second sensing electrode layer 204 may be the sensing electrode layer 204 of FIG. 4.

Each of the first sensing electrode layer 202 and the second sensing electrode layer 204 may include a sensing electrode. The sensing electrode may have a single-layer structure or a multi-layer structure of layers stacked in the third direction DR3.

The sensing electrode having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. The transparent conductive layer may include conductive polymer such as PEDOT, metal nanowire, graphene, or the like.

The sensing electrode having the multi-layer structure may include metal layers. The metal layers may have a three-layer structure of titanium/aluminum/titanium. The sensing electrode having the multi-layer structure may include at least one metal layer and at least one transparent conductive layer.

The second sensing electrode layer 204 may have a thickness greater than a thickness of the first sensing electrode layer 202. For example, the thickness of the second sensing electrode layer 204 may be about one-and-a-half times (1.5) greater than the thickness of the first sensing electrode layer 202. For example, the thickness of the first sensing electrode layer 202 may be about 1,950 angstroms, and the thickness of the second sensing electrode layer 204 may be about 3,100 angstroms. However, the embodiments are not limited thereto. In an embodiment, the thickness of the first sensing electrode layer 202 and the thickness of the second sensing electrode layer 204 may be equal to each other, or the thickness of the first sensing electrode layer 202 may be greater than the thickness of the second sensing electrode layer 204.

At least one of the sensing insulating layer 203 and the insulating layer 205 may include an inorganic material. The inorganic material may include at least one of aluminum oxide, titanium oxide, silicon oxide, silicon oxynitride, zirconium oxide, and hafnium oxide.

At least one of the sensing insulating layer 203 and the insulating layer 205 may include an organic material. The organic material may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

In an embodiment, the sensing insulating layer 203 may include an inorganic material, and the insulating layer 205 may include an organic material. The sensing insulating layer 203 may have a thickness of about 3,000 angstroms, and the insulating layer 205 may have a thickness in a range of about 17,500 angstroms to about 25,000 angstroms. However, the thickness of the sensing insulating layer 203 and the thickness of the insulating layer 205 are not limited thereto.

The opening 205-OP may be defined through a portion of the insulating layer 205. The opening 205-OP may overlap the light emitting area PXA. An upper surface of the sensing insulating layer 203 may be exposed through the opening 205-OP.

The opening 205-OP may be formed by coating a material for the insulating layer 205 and patterning the material when the insulating layer 205 is formed. Accordingly, in case that the insulating layer 205 is formed using a photoresist material, a process of forming the opening 205-OP may be simplified. In case that the insulating layer 205 is formed using a material other than the photoresist material, the opening 205-OP is formed through a complicated process of forming a separate photoresist layer on the insulating layer 205, exposing and developing the photoresist layer, etching an upper surface of the material for the insulating layer 205, and removing the photoresist layer. In an embodiment, since the insulating layer 205 is formed using the photoresist material, the insulating layer 205 through which the opening 205-OP is defined may be formed through a simplified process of coating the photoresist material, exposing the photoresist material, and developing the photoresist material. An example photoresist material used to form the insulating layer 205 may include acrylate. However, the embodiments are not limited thereto.

The high-refractive index layer 300 may be disposed on the insulating layer 205 and may be disposed in the opening 205-OP defined through the insulating layer 205. The high-refractive index layer 300 may provide a flat upper surface. The high-refractive index layer 300 may be formed by an inkjet printing method or a screen printing method. The high-refractive index layer 300 may include at least one of zirconium oxide particles, aluminum oxide particles, and titanium oxide particles and siloxane. However, this is merely an example, and the material for the high-refractive index layer 300 is not limited thereto.

The high-refractive index layer 300 may have a first refractive index greater than a second refractive index of the insulating layer 205. The first refractive index of the high-refractive index layer 300 may be in a range of about 1.65 to about 1.75. For example, the first refractive index may be about 1.7. The second refractive index of the insulating layer 205 may be in a range of about 1.45 to about 1.55. For example, the second refractive index may be about 1.53. The light provided from the light emitting layer EL may be emitted not only in the front direction, e.g., the third direction DR3, but also in the lateral direction. The light efficiency may be determined based on a light LT0 emitted in the front direction. In an embodiment, a light LT1 emitted in the lateral direction may be refracted or total-reflected because of a difference in refractive index between a side surface of the insulating layer 205 defining the opening 205-OP and the high-refractive index layer 300. Accordingly, the path of the light may be changed in the third direction DR3 or a direction closer to the third direction DR3. As a result, the light efficiency of the display device 1000 (refer to FIG. 1) may be improved.

Figure 6:
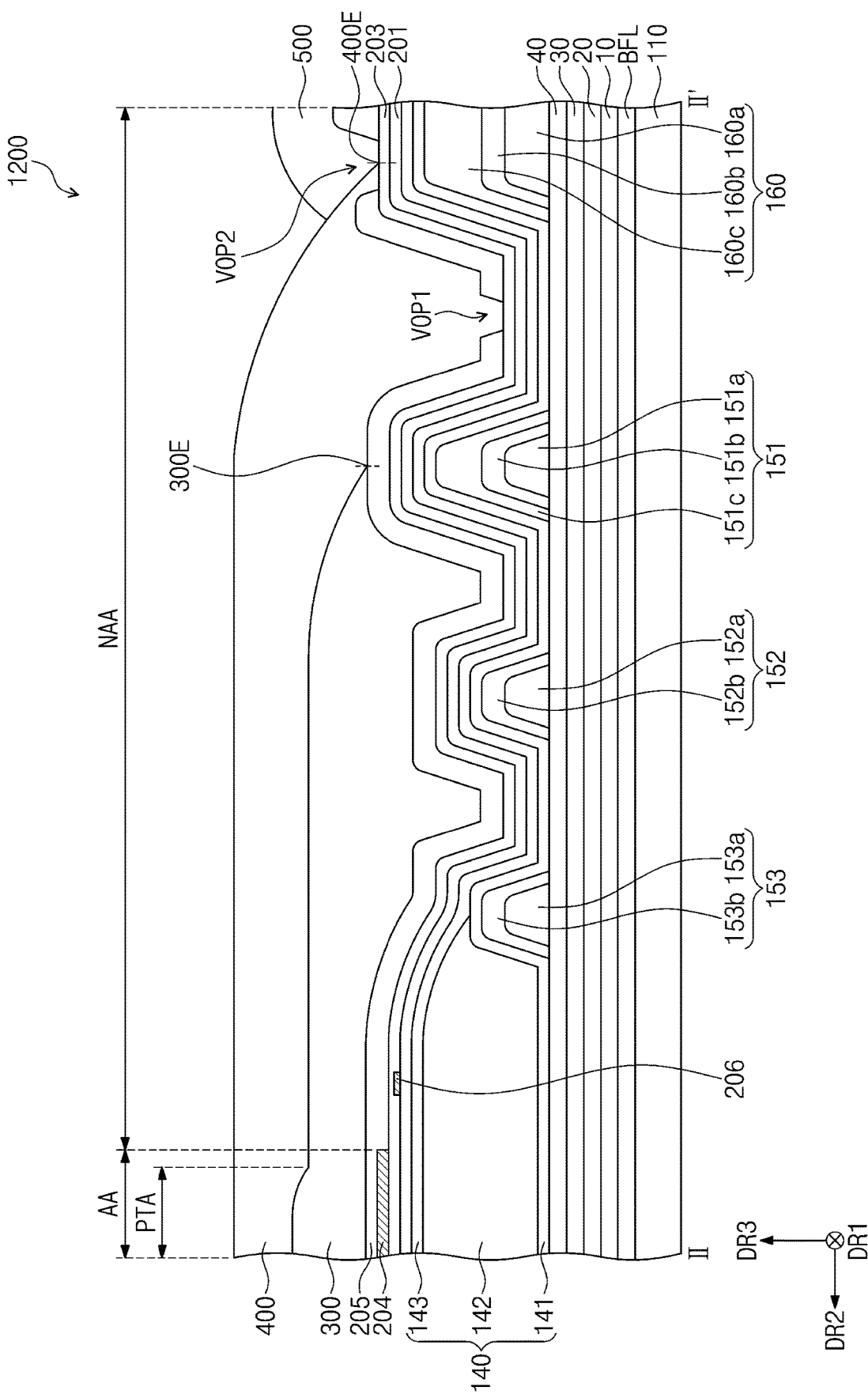
FIG. 6 is a schematic cross-sectional view taken along line II-II' of FIG. 4.

FIG. 6 is a schematic cross-sectional view taken along line II-II' of FIG. 4. In FIG. 6, the same reference numerals denote the same elements in FIG. 5, and thus, detailed descriptions of the same elements will be omitted.

Referring to FIG. 6, the display panel 1200 may include a polarizing layer 400 and a protecting layer 500.

The encapsulation layer 140 may include a first inorganic layer 141, an organic layer 142, and a second inorganic layer 143.

The first protrusion 151, the second protrusion 152, and the third protrusion 153 may be disposed under the high-refractive index layer 300. The first protrusion 151, the second protrusion 152, and the third protrusion 153 may be disposed to be spaced apart from each other. The first protrusion 151 may be referred to as a first dam. The second protrusion 152 may be referred to as a second dam. The third protrusion 153 may be referred to as a third dam.

In case that an organic monomer is printed to form the organic layer 142, the first protrusion 151, the second protrusion 152, and the third protrusion 153 may prevent the organic monomer from overflowing.

Each of the first protrusion 151, the second protrusion 152, and the third protrusion 153 may have a multiple-stacked structure. For example, the first protrusion 151 may include a first protrusion portion 151a, a second protrusion portion 151b stacked on the first protrusion portion 151a, and a third protrusion portion 151c stacked on the second protrusion portion 151b. The second protrusion 152 may include a first protrusion portion 152a and a second protrusion portion 152b stacked on the first protrusion portion 152a. The third protrusion 153 may include a first protrusion portion 153a and a second protrusion portion 153b stacked on the first protrusion portion 153a.

The first protrusion portion 151a and the fifth insulating layer 50 (refer to FIG. 5) may include substantially the same material and may be formed by substantially the same process. The first protrusion portion 151a may include an organic material.

The first protrusion portion 152a, the first protrusion portion 153a, the second protrusion portion 151b, and the sixth insulating layer 60 (refer to FIG. 5) may include substantially the same material and may be formed by substantially the same process.

The second protrusion portion 152b, the second protrusion portion 153b, the third protrusion portion 151c, and the pixel definition layer 70 (refer to FIG. 5) may include substantially the same material and may be formed by substantially the same process.

The insulating layer 205 may be disposed on the display layer 100 (refer to FIG. 5). The first organic opening VOP1 and the second organic opening VOP2 may be defined in the peripheral area NAA of the insulating layer 205. The first organic opening VOP1 may be referred to as a second opening VOP1.

The first organic opening VOP1 may be defined between an end 400E of the polarizing layer 400 and the first protrusion 151.

The second organic opening VOP2 may be defined above a protrusion 160. The protrusion 160 may include a first protrusion portion 160a, a second protrusion portion 160b stacked on the first protrusion portion 160a, and a third protrusion portion 160c stacked on the second protrusion portion 160b.

The first protrusion portion 160a and the fifth insulating layer 50 (refer to FIG. 5) may include substantially the same material and may be formed by substantially the same process. The first protrusion portion 160a may include an organic material. The first protrusion portion 160a and the first protrusion portion 151a may include substantially the same material.

The second protrusion portion 160b and the sixth insulating layer 60 (refer to FIG. 5) may include substantially the same material and may be formed by substantially the same process. The second protrusion portion 160b and the second protrusion portion 151b may include substantially the same material.

The third protrusion portion 160c and the pixel definition layer 70 (refer to FIG. 5) may include substantially the same material and may be formed by substantially the same process. The third protrusion portion 160c and the third protrusion portion 151c may include substantially the same material.

The high-refractive index layer 300 may be disposed on the insulating layer 205 and may be spaced apart from the first organic opening VOP1. The high-refractive index layer 300 may not overlap the first organic opening VOP1. The high-refractive index layer 300 may overlap the first protrusion 151.

The high-refractive index layer 300 may have properties of spreading easily in an organic material and refraining from migrating to an inorganic material at a boundary between the organic material and the inorganic material. For example, when the high-refractive index layer 300 is formed, the insulating layer 205 may include an organic material, and the sensing insulating layer 203 may include an inorganic material. The first organic opening VOP1 and the second organic opening VOP2 may be formed through the insulating layer 205. Then, the high-refractive index layer 300 may be formed on the insulating layer 205. The high-refractive index layer 300 may spread in the insulating layer 205 including an organic material and may stop at the area adjacent to the first organic opening VOP1 through which (or in which) the sensing insulating layer 203 including an inorganic material is exposed. Then, the high-refractive index layer 300 may be compression-cured by a curing process to form the end 300E on the first protrusion 151. However, this is merely an example. For example, the end 300E of the high-refractive index layer 300 may be formed between the first protrusion 151 and the first organic opening VOP1.

It is necessary to prevent the light emitting layer EL (refer to FIG. 5) disposed under the high-refractive index layer 300 from being damaged when the high-refractive index layer 300 is cured. For example, when the high-refractive index layer 300 is formed, it is desired to use a material that does not require a high-temperature thermosetting process. This is because the light emitting layer EL (refer to FIG. 5), which has been formed and disposed under the high-refractive index layer 300, may be damaged in case that the high-temperature thermosetting process is performed. Accordingly, materials for the insulating layer 205 and the high-refractive index layer 300 may be capable of low-temperature thermosetting without damaging the light emitting layer EL (refer to FIG. 5) disposed below or capable of ultraviolet curing (UV curing) without affecting the light emitting layer EL disposed below.

A protrusion PTA protruding in the third direction DR3 may be formed in an area adjacent to a boundary between the peripheral area NAA and the active area AA of the high-refractive index layer 300. FIG. 6 shows the protrusion PTA that overlaps the active area AA. However, a position of the protrusion PTA is not limited thereto. For example, the protrusion PTA may overlap the peripheral area NAA. In this case, the light blocking layer of the window 1100 (refer to FIG. 2) disposed in the peripheral area NAA may make the protrusion PTA not viewable from the outside of the display device 1000 (refer to FIG. 1). The protrusion PTA may be a portion that is inevitably formed during the formation of the high-refractive index layer 300. The protrusion PTA may be formed to be spaced apart from the end 300E. In case that the thickness of the protrusion PTA exceeds a predetermined thickness, the protrusion PTA may be viewed from the outside. In an embodiment, however, the end 300E of the high-refractive index layer 300 may be controlled by the first organic opening VOP1. For example, the area in which the high-refractive index layer 300 is disposed may be controlled by the first organic opening VOP1. A flatness of the upper surface of the high-refractive index layer 300 may be controlled by the controlled area of the high-refractive index layer 300. The first organic opening VOP1 may reduce a protruding degree of the protrusion PTA. For example, the first organic opening VOP1 may reduce a thickness of the protrusion PTA or may control the protrusion PTA to overlap the peripheral area NAA. Accordingly, the protrusion PTA may be prevented from being viewed from the outside of the display device 1000 (refer to FIG. 1). As a result, the display device 1000 (refer to FIG. 1) having improved reliability may be provided.

The polarizing layer 400 may be disposed between the window 1100 and the high-refractive index layer 300. The polarizing layer 400 may include a polarizer and a retarder. The polarizer and the retarder may include a stretching type synthetic resin film or a coating type synthetic resin film. For example, the polarizing layer 400 may be provided by dyeing an iodine compound on a polyvinyl alcohol film (PVA film). The polarizing layer 400 may reduce the reflectance of the external light.

In an embodiment, the polarizing layer 400 may include color filters. The color filters may be arranged in a predetermined arrangement. For example, the arrangement of the color filters may be determined by taking into account the colors of the lights emitted from the pixels included in the display layer 100 (refer to FIG. 5). In another embodiment, the anti-reflection layer may include a destructive interference structure. For instance, the destructive interference structure may include a first reflective layer and a second reflective layer disposed on different layers. A first reflective light and a second reflective light, which are respectively reflected from the first reflective layer and the second reflective layer, may destructively interfere with each other, and thus, the reflectance of the external light may be reduced.

The polarizing layer 400 may overlap the high-refractive index layer 300. For example, the polarizing layer 400 may seal the high-refractive index layer 300. At least a portion of the polarizing layer 400 may overlap the first organic opening VOP1. For example, the polarizing layer 400 may overlap the first organic opening VOP1 and a portion of the second organic opening VOP2. An end 400E of the polarizing layer 400 may be controlled by the second organic opening VOP2. The end 400E of the polarizing layer 400 may overlap the encapsulation layer 140.

The protecting layer 500 may be disposed in the first area NA1 (refer to FIG. 2) and the bending area BA (refer to FIG. 2). The protecting layer 500 may be disposed to be spaced apart from the high-refractive index layer 300. The protecting layer 500 may not overlap the first organic opening VOP1. The protecting layer 500 may prevent the circuit layer 120 (refer to FIG. 4) from being damaged in case that the display panel 1200 is bent. The protecting layer 500 may contact the polarizing layer 400. However, this is merely an example, and the arrangement between the protecting layer 500 and the polarizing layer 400 is not limited thereto. For example, the protecting layer 500 and the polarizing layer 400 may be disposed to be spaced apart from each other.

An interfacial adhesion property between the high-refractive index layer 300 and the protecting layer 500 may be weaker than an interfacial adhesion property between the polarizing layer 400 and the protecting layer 500. For example, in case that the high-refractive index layer 300 contacts the protecting layer 500, the protecting layer 500 may be detached because of the weaker interfacial adhesion property. However, in an embodiment, the high-refractive index layer 300 may not overlap the first organic opening VOP1. The end 300E of the high-refractive index layer 300 may be disposed closer to the active area AA than the first organic opening VOP1 is. The protecting layer 500 may be spaced apart from the active area AA with the first organic opening VOP1 interposed therebetween. The first organic opening VOP1 may prevent the high-refractive index layer 300 from contacting the protecting layer 500. The protecting layer 500 may be prevented from being detached because of the interfacial adhesion property between the high-refractive index layer 300 and the protecting layer 500. Accordingly, the display device 1000 (refer to FIG. 1) may have the improved reliability.

Figure 7:
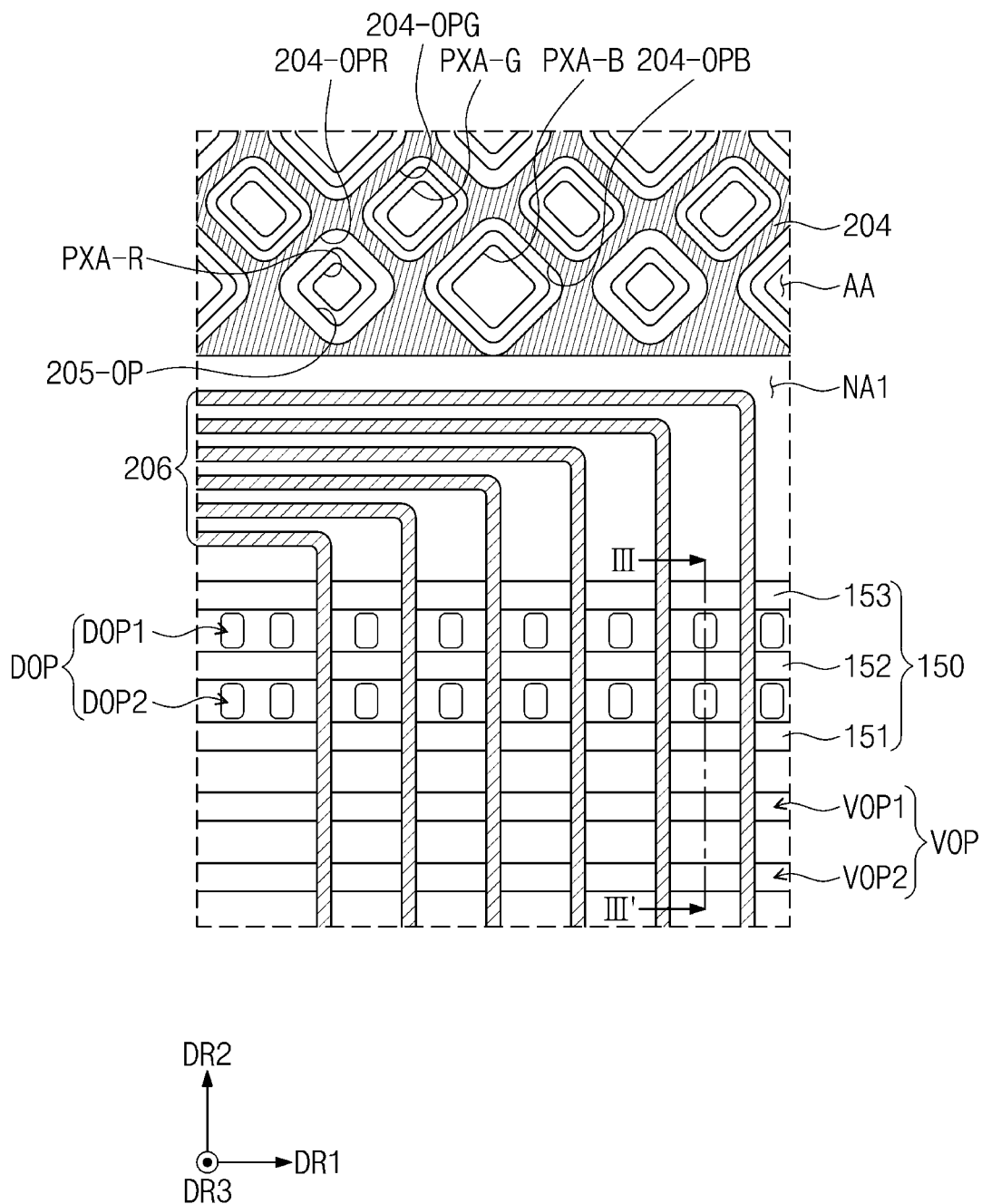
FIG. 7 is a schematic plan view showing an area corresponding to area AA' of FIG. 2 according to an embodiment.

FIG. 7 is a schematic plan view showing an area corresponding to area AA' of FIG. 2 according to an embodiment. In FIG. 7, the same reference numerals denote the same elements in FIG. 4, and thus, detailed descriptions of the same elements will be omitted.

Referring to FIG. 7, dam openings DOP may be defined in a first area NA1. The dam openings DOP may be disposed between protrusions 150. Each of the dam openings DOP and a third pixel area PXA-G may have substantially the same shape. However, this is merely an example, and the shape of each of the dam openings DOP is not limited thereto. For example, each of the dam openings DOP may have a rectangular shape.

The dam openings DOP may include first dam openings DOP1 and second dam openings DOP2.

The first dam openings DOP1 may be disposed between a second protrusion 152 and a third protrusion 153. The first dam openings DOP1 may be arranged in the first direction DR1 to be spaced apart from each other.

The second dam openings DOP2 may be disposed between a first protrusion 151 and the second protrusion 152. The second dam openings DOP2 may be arranged in the first direction DR1 to be spaced apart from each other.

Figure 8:
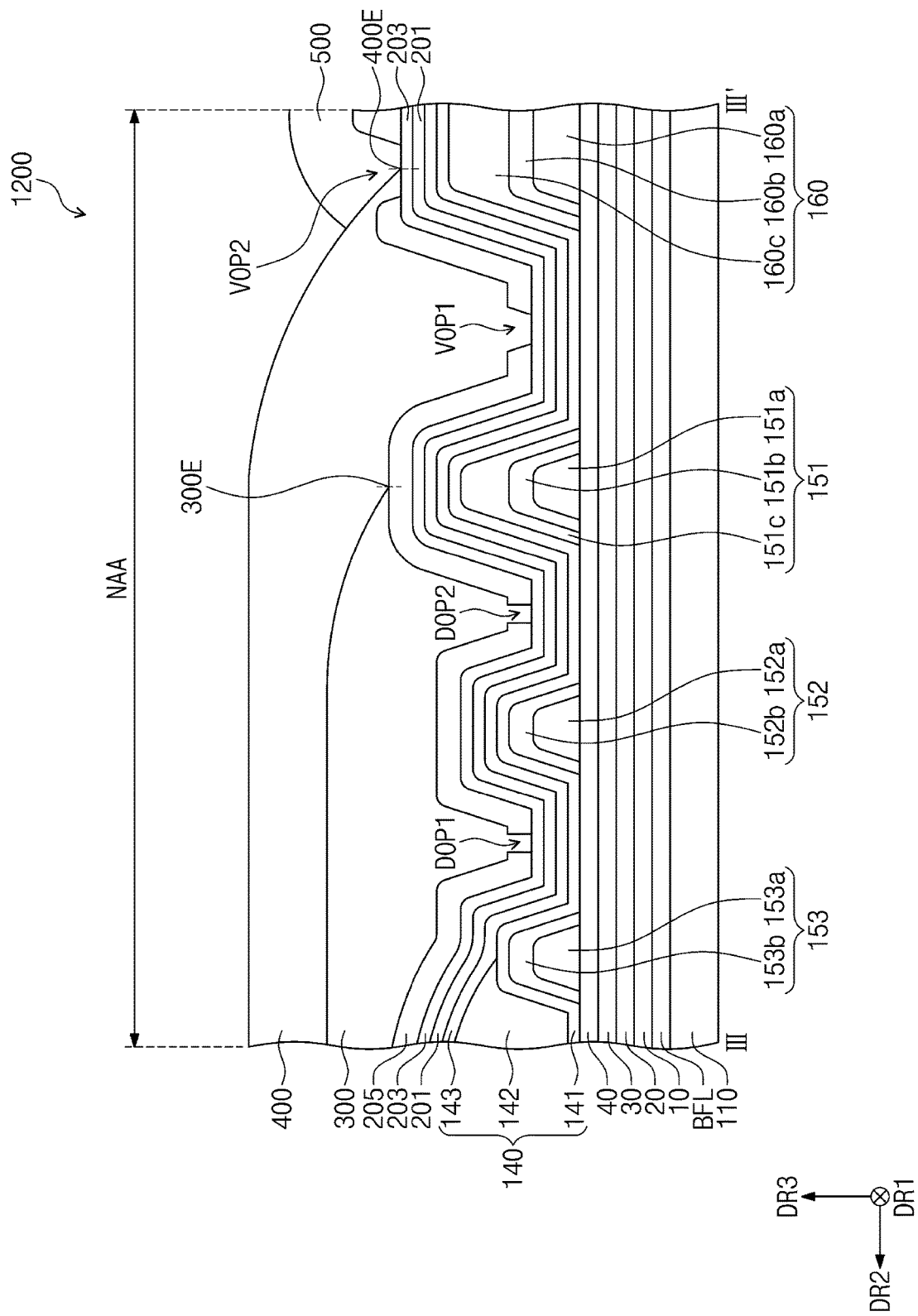
FIG. 8 is a schematic cross-sectional view taken along line III-III' of FIG. 7.

FIG. 8 is a schematic cross-sectional view taken along line III-III' of FIG. 7. In FIG. 8, the same reference numerals denote the same elements in FIG. 6, and thus, detailed descriptions of the same elements will be omitted.

Referring to FIG. 8, the first dam opening DOP1 and the second dam opening DOP2 may be defined in a peripheral area NAA of an insulating layer 205. The second dam opening DOP2 may be referred to as a third opening DOP2.

The first dam opening DOP1 may be disposed between the third protrusion 153 and the second protrusion 152. The second dam opening DOP2 may be disposed between the second protrusion 152 and the first protrusion 151. The first dam opening DOP1 and the second dam opening DOP2 may be spaced apart from each other in the second direction DR2 with the second protrusion 152 interposed therebetween.

A high-refractive index layer 300 may cover or overlap the first dam opening DOP1 and the second dam opening DOP2. For example, the high-refractive index layer 300 may fill in the first dam opening DOP1 and the second dam opening DOP2.

According to the disclosure, the first dam opening DOP1 and the second dam opening DOP2 may be covered or overlapped by the high-refractive index layer 300, and a flatness of an upper surface of the high-refractive index layer 300 may be controlled (or adjusted). The first dam opening DOP1 and the second dam opening DOP2 may be controlled such that a thickness of a protrusion (not shown in FIG. 8; refer to the protrusion PTA of FIG. 6) of the high-refractive index layer 300 may be reduced or the protrusion (not shown in FIG. 8; refer to the protrusion PTA of FIG. 6) may overlap the peripheral area NAA. Accordingly, the protrusion (not shown in FIG. 8; refer to the protrusion PTA of FIG. 6) may be prevented from being viewed from the outside of the display device 1000 (refer to FIG. 1). As a result, the reliability of the display device 1000 (refer to FIG. 1) may be improved.

Figure 9:
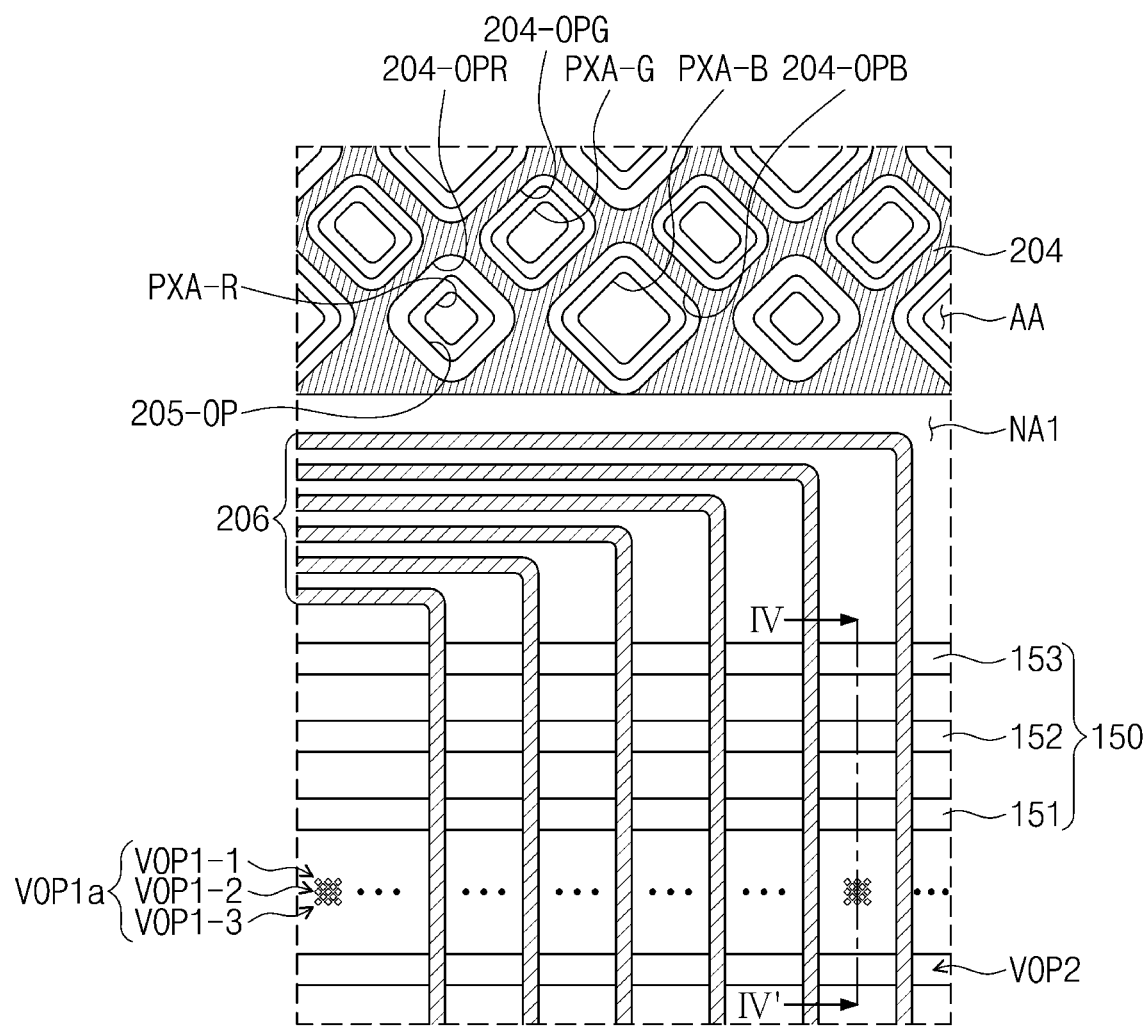
FIG. 9 is a schematic plan view showing an area corresponding to area AA' of FIG. 2 according to an embodiment.

FIG. 9 is a schematic plan view showing an area corresponding to area AA' of FIG. 2 according to an embodiment. In FIG. 9, the same reference numerals denote the same elements in FIG. 4, and thus, detailed descriptions of the same elements will be omitted.

Referring to FIG. 9, first organic openings VOP1*a* may be defined in a first area NA1. The first organic openings VOP1*a* may be disposed between a first protrusion portion 151 and a second organic opening VOP2. Each of the first organic openings VOP1*a* may have a lozenge or diamond shape in a plan view. The lozenge or diamond shape may have desired surface tension with the high-refractive index layer 300 (refer to FIG. 6). However, this is merely an example, and the shape of each of the first organic openings VOP1*a* is not limited thereto. For example, each of the first organic openings VOP1*a* may have a circular shape in a plan view. The first organic openings VOP1*a* may be arranged in the first direction DR1 and the second direction DR2.

The first organic openings VOP1*a* may include a first opening VOP1-1, a second opening VOP1-2, and a third opening VOP1-3. The first opening VOP1-1, the second opening VOP1-2, and the third opening VOP1-3 may be arranged in the second direction DR2 to be spaced apart from each other.

Figure 10:
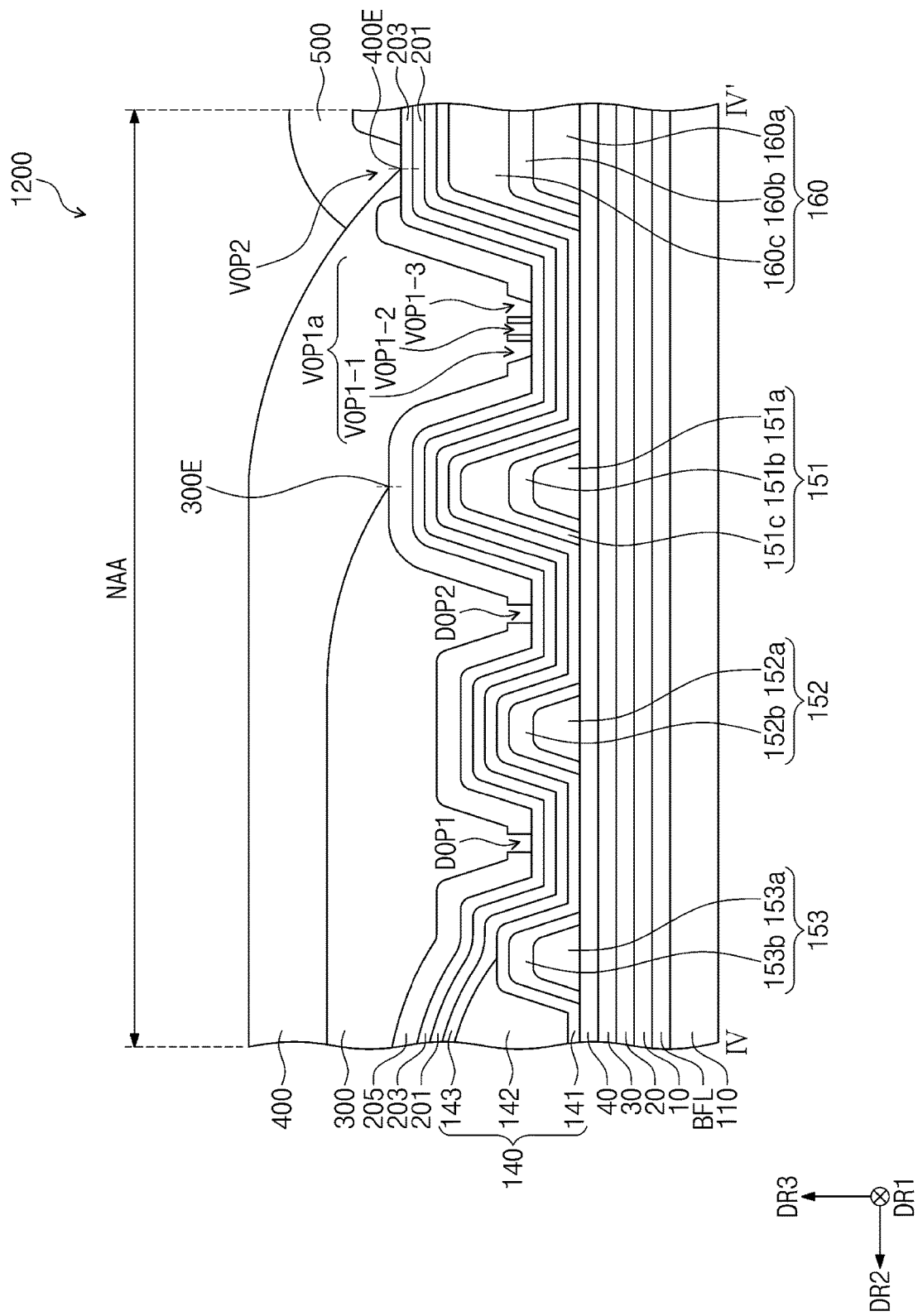
FIG. 10 is a schematic cross-sectional view taken along line IV-IV' of FIG. 9.

FIG. 10 is a schematic cross-sectional view taken along line IV-IV' of FIG. 9. In FIG. 10, the same reference numerals denote the same elements in FIG. 6, and thus, detailed descriptions of the same elements will be omitted.

Referring to FIG. 10, the first organic openings VOP1*a* may be defined in a peripheral area NAA of an insulating layer 205. The first organic openings VOP1*a* may be referred to as second openings VOP1*a*.

The first organic openings VOP1a may be disposed between an end 400E of a polarizing layer 400 and the first protrusion portion 151.

The high-refractive index layer 300 may be spaced apart from the first organic openings VOP1a. The high-refractive index layer 300 may not overlap the first organic openings VOP1a.

The first organic openings VOP1a may include a first opening VOP1-1, a second opening VOP1-2, and a third opening VOP1-3. Because of a surface tension of each of the first opening VOP1-1, the second opening VOP1-2, and the third opening VOP1-3, an end 300E of the high-refractive index layer 300 may be prevented from overflowing into the first organic openings VOP1a. The high-refractive index layer 300 may be overlapped by the polarizing layer 400.

In the embodiment, the high-refractive index layer 300 may not overlap a protecting layer 500. The end 300E of the high-refractive index layer 300 may be disposed closer to an active area AA than the first organic openings VOP1a are. The protecting layer 500 may be spaced apart from the active area AA with the first organic openings VOP1a interposed therebetween. The first organic openings VOP1a may prevent the high-refractive index layer 300 from contacting the protecting layer 500. Accordingly, the protecting layer 500 may be prevented from being detached because of the interfacial adhesion property between the high-refractive index layer 300 and the protecting layer 500.

In the embodiment, the end 300E of the high-refractive index layer 300 may be controlled by the first organic openings VOP1a. For example, the area in which the high-refractive index layer 300 is disposed may be controlled by the first organic openings VOP1a. The flatness of an upper surface of the high-refractive index layer 300 may be controlled by the controlled area of the high-refractive index layer 300. The first organic openings VOP1a may reduce a protruding degree of a protrusion (not shown in FIG. 10; refer to the protrusion PTA of FIG. 6). The first organic openings VOP1a may reduce a thickness of the protrusion (not shown in FIG. 10; refer to the protrusion PTA of FIG. 6) or may control the protrusion (not shown in FIG. 10; refer to the protrusion PTA of FIG. 6) to overlap the peripheral area NAA. Accordingly, the protrusion (not shown in FIG. 10; refer to the protrusion PTA of FIG. 6) may be prevented from being viewed from the outside of the display device 1000 (refer to FIG. 1). As a result, the display device 1000 (refer to FIG. 1) having improved reliability may be provided.

Figure 11:
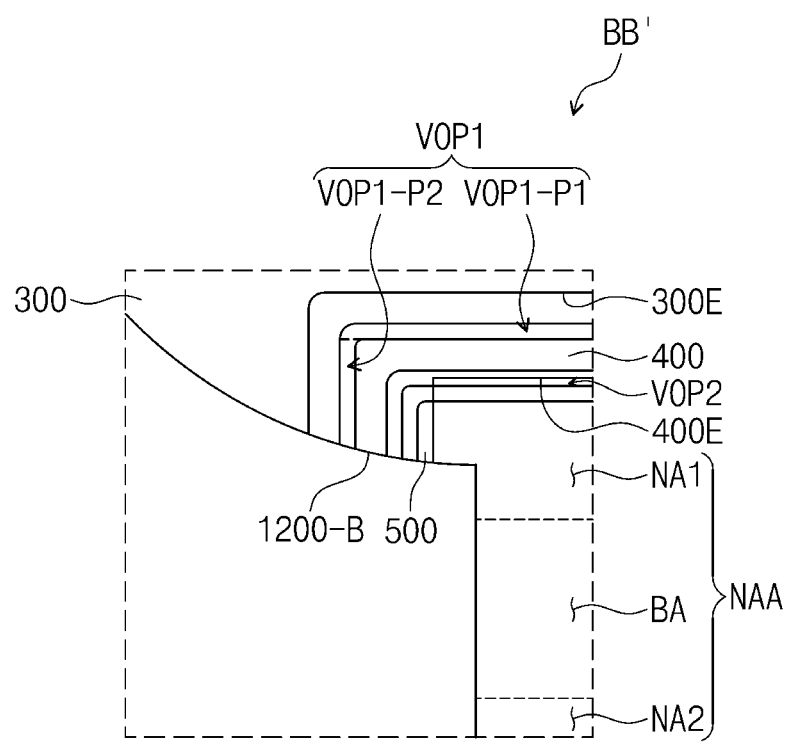
FIG. 11 is a schematic plan view showing area BB' of FIG. 2 according to an embodiment.

FIG. 11 is a schematic plan view showing area BB' of FIG. 2 according to an embodiment.

Referring to FIG. 11, a first portion VOP1-P1 extending in the first direction DR1 and a second portion VOP1-P2 protruding in the second direction DR2 may be defined in a first organic opening VOP1. The second portion VOP1-P2 may protrude toward an edge 1200-B of the display panel 1200 (refer to FIG. 2).

An end 300E of a high-refractive index layer 300 may be disposed to be spaced apart from the first portion VOP1-P1 in the second direction DR2 and may be disposed to be spaced apart from the second portion VOP1-P2 in the first direction DR1.

A polarizing layer 400 may overlap portions of the high-refractive index layer 300, the first organic opening VOP1, and a second organic opening VOP2. The polarizing layer 400 may have an area greater than an area of the high-refractive index layer 300.

An end 400E of the polarizing layer 400 may be disposed to be spaced apart from the first portion VOP1-P1 in the second direction DR2 and may be disposed to be spaced apart from the second portion VOP1-P2 in the first direction DR1.

A protecting layer 500 may overlap a portion of the polarizing layer 400, the first area NA1, and the bending area BA.

The protecting layer 500 may be spaced apart from the high-refractive index layer 300 in the second direction DR2 with the first portion VOP1-P1 interposed therebetween and may be spaced apart from the high-refractive index layer 300 in the first direction DR1 with the second portion VOP1-P2 interposed therebetween.

In the embodiment, the first portion VOP1-P1 and the second portion VOP1-P2 may prevent the high-refractive index layer 300 from contacting the protecting layer 500. The protecting layer 500 may be prevented from being detached because of the weaker interfacial adhesion property between the high-refractive index layer 300 and the protecting layer 500. Accordingly, the reliability of the display device 1000 (refer to FIG. 1) may be improved.

Figure 12:
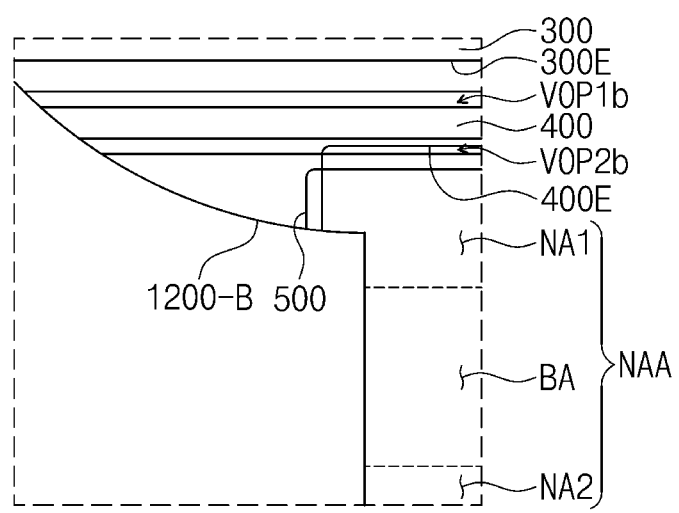
FIG. 12 is a schematic plan view showing an area corresponding to area BB' of FIG. 2 according to an embodiment.

FIG. 12 is a schematic plan view showing an area corresponding to area BB' of FIG. 2 according to an embodiment.

Referring to FIG. 12, a first organic opening VOP1b may extend in the first direction DR1. The first organic opening VOP1b may be spaced apart from an edge 1200-B of the display panel 1200 (refer to FIG. 2) in the second direction DR2.

An end 300E of a high-refractive layer 300 may be disposed to be spaced apart from the first organic opening VOP1b in the second direction DR2.

A polarizing layer 400 may overlap portions of the high-refractive index layer 300, the first organic opening VOP1b, and a second organic opening VOP2b. The polarizing layer 400 may have an area greater than an area of the high-refractive index layer 300.

An end 400E of the polarizing layer 400 may be disposed to be spaced apart from the first organic opening VOP1b in the second direction DR2.

A protecting layer 500 may overlap a portion of the polarizing layer 400, the first area NA1, and the bending area BA.

The protecting layer 500 may be spaced apart from the high-refractive index layer 300 in the second direction DR2 with the first organic opening VOP1b interposed therebetween.

According to the disclosure, the first organic opening VOP1b may prevent the high-refractive index layer 300 from contacting the protecting layer 500. The protecting layer 500 may be prevented from being detached because of the interfacial adhesion property between the high-refractive index layer 300 and the protecting layer 500. Accordingly, the reliability of the display device 1000 (refer to FIG. 1) may be improved.

Although the embodiments of the disclosure have been described, it is understood that the disclosure should not be limited to these embodiments but various changes and modifications can be made by one of ordinary skill in the art within the spirit and scope of the disclosure as hereinafter claimed. Therefore, the disclosed subject matter should not be limited to any single embodiment described herein, and the scope of the claimed invention shall be determined according to the attached claims.

What is claimed is:

1. A display device comprising:
   a display layer comprising:
      an active area comprising a plurality of pixel areas; and a peripheral area adjacent to the active area;
an insulating layer disposed on the display layer, the insulating layer comprising:
at least one first opening overlapping the plurality of pixel areas; and
at least one second opening in the peripheral area;
a refractive index layer disposed on the insulating layer, having a refractive index greater than a refractive index of the insulating layer, and spaced apart from the at least one second opening of the insulating layer; and
a polarizing layer overlapping the refractive index layer, wherein
at least a portion of the polarizing layer overlaps the at least one second opening.

2. The display device of claim 1, wherein the refractive index layer does not overlap the at least one second opening.

3. The display device of claim 1, wherein the polarizing layer overlaps the at least one second opening.

4. The display device of claim 1, further comprises a protecting layer, wherein
the peripheral area comprises a bending area, and
the protecting layer is disposed in the bending area and spaced apart from the refractive index layer.

5. The display device of claim 4, wherein the protecting layer contacts the polarizing layer.

6. The display device of claim 1, wherein the insulating layer comprises an organic material.

7. The display device of claim 1, wherein the polarizing layer has an area greater than an area of the refractive index layer in a plan view.

8. The display device of claim 1, wherein the at least one second opening of the insulating layer comprises:
a first portion extending in a first direction; and
a second portion extending toward an edge of the display layer in a second direction intersecting the first direction.

9. The display device of claim 8, wherein
an end of the refractive index layer and an end of the polarizing layer are spaced apart from each other, and
the at least one second opening is disposed between the ends of the refractive index layer and the polarizing layer.

10. The display device of claim 1, wherein the at least one second opening of the insulating layer extends in a first direction and is spaced apart from an edge of the display layer in a second direction intersecting the first direction.

11. The display device of claim 1, further comprising a first protrusion disposed in the peripheral area, surrounding at least a portion of the active area, and disposed under the refractive index layer.

12. The display device of claim 11, wherein the at least one second opening of the insulating layer is disposed between an end of the polarizing layer and the first protrusion.

13. The display device of claim 10, wherein the refractive index layer overlaps a first protrusion.

14. The display device of claim 11, further comprising a second protrusion disposed in the peripheral area, surrounding at least a portion of the active area, and spaced apart from the at least one second opening of the insulating layer,
wherein the first protrusion is disposed between the second protrusion and at least one second opening.

15. The display device of claim 14, wherein the insulating layer comprises at least one third opening between the first protrusion and the second protrusion.

16. The display device of claim 15, wherein the refractive index layer overlaps the at least one third opening.

17. The display device of claim 15, wherein
the at least one third opening comprises a plurality of third openings, and
the plurality of third openings are spaced apart from each other in a first direction in a plan view.

18. The display device of claim 1, wherein
the at least one second opening comprises a plurality of second openings, and
the plurality of second openings are spaced apart from each other in a first direction and a second direction intersecting the first direction.

19. A display device comprising:
a display layer comprising:
an active area comprising a plurality of pixel areas;
a first area adjacent to the active area; and
a bending area adjacent to the first area;
a sensor layer disposed on the display layer, the sensor layer comprising a plurality of sensing electrodes;
an insulating layer disposed on the sensor layer, the insulating layer comprising:
at least one first opening overlapping the plurality of pixel areas; and
at least one second opening overlapping the first area;
a refractive index layer disposed on the insulating layer and spaced apart from the at least one second opening, wherein the refractive index layer has a refractive index greater than a refractive index of the insulating layer; and
a protecting layer spaced apart from the refractive index layer and overlapping the bending area.

20. The display device of claim 19, wherein
the refractive index layer does not overlap the at least one second opening, and
the protecting layer does not overlap the at least one second opening.

21. The display device of claim 19, wherein
the insulating layer comprises an organic material, and
the refractive index layer is disposed directly on the insulating layer.

22. The display device of claim 19, wherein the insulating layer comprises a third opening between the at least one second opening and the active area.

23. The display device of claim 22, wherein the third opening is filled with the refractive index layer.

24. The display device of claim 19, wherein
the at least one second opening comprises a plurality of second openings, and
the plurality of second openings are spaced apart from each other in a first direction and a second direction intersecting the first direction.

* * * * *